(12) United States Patent
Maruyama et al.

(10) Patent No.: US 6,570,149 B2
(45) Date of Patent: May 27, 2003

(54) PHOTODETECTOR HAVING A CONTROL BLOCK FOR MAINTAINING A DETECTION SIGNAL WITHIN A PREDETERMINED TOLERANCE RANGE

(75) Inventors: Tomoyuki Maruyama, Nagano (JP); Makoto Kudo, Nagano (JP); Fumio Narusawa, Nagano (JP)

(73) Assignee: Hioki Denki Kabushiki Kaisha, Nagona (JP)

( * ) Notice: Subject to any disclaimer, the term of this patent is extended or adjusted under 35 U.S.C. 154(b) by 48 days.

(21) Appl. No.: 09/812,682

(22) Filed: Mar. 21, 2001

(65) Prior Publication Data

US 2001/0023944 A1 Sep. 27, 2001

(30) Foreign Application Priority Data

Mar. 23, 2000 (JP) .................... 2000-081108

(51) Int. Cl.⁷ .............................. H01J 40/14
(52) U.S. Cl. .................... 250/238; 250/214 R
(58) Field of Search .................... 250/238, 214 R; 348/241, 243, 244

(56) References Cited

U.S. PATENT DOCUMENTS

| | | | |
|---|---|---|---|
| 4,551,762 A | * 11/1985 | Levine | 348/244 |
| 4,580,168 A | * 4/1986 | Levine | 348/244 |
| 4,739,409 A | * 4/1988 | Baumeister | 348/244 |
| 4,933,543 A | * 6/1990 | Hull | 250/214 C |

FOREIGN PATENT DOCUMENTS

| | | |
|---|---|---|
| JP | 61248628 | 11/1986 |
| JP | 2-22873 | 1/1990 |
| JP | 4-279879 | 10/1992 |
| JP | 7-63854 | 3/1995 |

OTHER PUBLICATIONS

English Language Abstract of JP 61–248628.
English Language Abstract of JP 2–22873.
English Language Abstract of JP 4–279879.
English Language Abstract of JP 7–63854.

* cited by examiner

Primary Examiner—Stephone Allen
Assistant Examiner—Eric J Spears
(74) Attorney, Agent, or Firm—Greenblum & Bernstein, P.L.C.

(57) ABSTRACT

There is disclosed a photodetector which is capable of attaining an enhanced detection accuracy, and at the same time permits reduction in the size and manufacturing costs thereof. An avalanche photodiode detects an incident light, in a state of a predetermined bias voltage set thereto. A cooler cools the avalanche photodiode to a predetermined cooling temperature. An amount of an incident signal light incident on the avalanche photodiode is detected based on a detection signal from the avalanche photodiode. A control block adjusts at least one of the bias voltage and the predetermined cooling temperature, thereby holding a value of the detection signal from the avalanche photodiode generated in a state of the incident light being blocked from impinging on the avalanche photodiode, within a predetermined tolerance range.

3 Claims, 3 Drawing Sheets

PHOTODETECTOR HAVING A CONTROL BLOCK FOR MAINTAINING A DETECTION SIGNAL WITHIN A PREDETERMINED TOLERANCE RANGE

BACKGROUND OF THE INVENTION

1. Field of the Invention

This invention relates to a photodetector which is capable of detecting extremely weak light by using a photodiode, and more particularly to a photodetector which is applicable to environmental measurements, such as measurement of water droplets and dust particles, analyses of gases and trace materials in industrial fields, medical diagnoses, etc.

2. Description of the Related Art

As a photodetector of this kind, the present assignee has already developed a photodetector 31 shown in FIG. 3. This photodetector 31 is configured such that an extremely weak near-infrared light can be detected by using an avalanche photodiode 11 as a photodetector element, and includes a cooling block 2 constructed such that the avalanche photodiode 11 can be mounted on a pedestal arranged therein. Further, the photodetector 31 includes a power supply block 13 for generating bias voltage applied to the avalanche photodiode 11, a voltage detection block 32 for detecting the bias voltage of the avalanche photodiode 11 to output the detection signal indicative of the sensed bias voltage to the power supply block 13, a temperature sensor 33 attached to the pedestal in the cooling block 2 together with the avalanche photodiode 11, a temperature sensor block 34 for approximately detecting an temperature of the avalanche photodiode 11 based on a signal from the temperature sensor 33, a cooler 15 for cooling the pedestal in the cooling block 2 to thereby maintain the temperature of the avalanche photodiode 11 detected by the temperature sensor block 34 at a predetermined temperature, and a sensor block 36 for detecting an amount of an incident light impinging on the avalanche photodiode 11 based on a detection signal from the avalanche photodiode 11.

According to the photodetector 31 constructed as above, first, the cooler 15 cools the avalanche photodiode 11 to the predetermined temperature, and the power supply block 13 maintains the bias voltage of the avalanche photodiode 11 at a predetermined voltage. In this state, the temperature sensor block 34 detects a temperature of the avalanche photodiode 11 based on the signal from the temperature sensor 33, and the cooler 15 cools the avalanche photodiode by feedback control such that the temperature of the avalanche photodiode 11 detected by the temperature sensor block 34 becomes equal to the predetermined temperature. At the same time, the power supply block 13 is feedback-controlled such that the bias voltage detected by the voltage detection block 32 becomes equal to the predetermined voltage, thereby maintaining the bias voltage of the avalanche photodiode 11 at the predetermined voltage. Then, a signal light is blocked from impinging on the avalanche photodiode 11, and in this state, the sensor block 36 detects the amount of noise based on a dark current flowing through the avalanche photodiode 11. Next, a signal light is permitted to impinge on the avalanche photodiode 11, and in this state, the sensor block 36 detects the amount of signal light incident on the avalanche photodiode 11. Then, the sensor block 36 causes the amount of noise contained in the detected amount of the signal light incident on the avalanche photodiode 11, and the amount of noise detected when the signal light is blocked from impinging on the same, to cancel each other, thereby detecting the amount of the incident signal light itself.

As described above, in the photodetector 31, feedback control is carried out such that operating conditions, such as the cooling temperature and the bias voltage of the avalanche photodiode 11 become constant, and at the same time the amount of noise is eliminated by cancellation from the detected amount of the incident signal light to thereby reduce an error in the detection of the amount of the signal light.

However, the photodetector 31 has room for improvement in the following points: The avalanche photodiode 11 has detection characteristics very sensitive to changes in the cooling temperature in units of $1/100°$ C. and changes in the bias voltage even in units of mV. On the other hand, heat enters the cooling block 2 from outside by way of an optical fiber cable connected to the avalanche photodiode 11, a cable for use in supply of the bias voltage, a cable for use in detecting the bias voltage, and a cable for use in detecting the temperature. In this case, if the amount of heat entering the cooling block 2 is constant, it is possible to hold the cooling temperature of the avalanche photodiode 11 constant to some extent by using the cooler 15, whereas if the ambient temperature outside the cooling block 2 changes, the amount of heat entering the cooling block 2 varies with this change. This causes as light change in the cooling temperature of the avalanche photodiode 11. Further, the sensitivity of the temperature sensor 33 per se varies with the lapse of time due to heat cycle etc. In addition, it is physically or mechanically difficult to bring the avalanche photodiode 11 into direct contact with the temperature sensor 33, and therefore, thermal resistance between them cannot be reduced to 0. As a result, the amount of change in temperature of the avalanche photodiode 11, and the amount of change in temperature detected by the temperature sensor 33 do not necessarily agree with each other. In view of the above problems, it is very difficult to control the temperature of the avalanche photodiode 11 itself to the order of accuracy of $1/100°$ C.

Further, although the bias voltage of the avalanche photodiode 11 is feedback-controlled such that the same becomes equal to a predetermined voltage, it is very difficult to control the bias voltage such that it is not changed even in units of mV. Therefore, according to the photodetector 31, there can be an error in detection of the amount of an incident signal light or the amount of noise due to a slight change in the operating conditions of the avalanche photodiode 11, so that even if the amount of noise is cancelled out, there remains an error in the detected amount of the incident signal light. Further, since the voltage detection block 32 is connected to the avalanche photodiode 11, there is a fear that mixing of noise from the voltage detection block 32 degrades the detection accuracy of the photodetector 31. Therefore, there is a demand for enhanced detection accuracy on the photodetector 31.

Additionally, in the photodetector 31, it is required to feedback-control the bias voltage and the cooling temperature of the avalanche photodiode 11 with very high accuracy, so that the voltage detection block 32 and the temperature sensor 33 are required to have a high-precision detecting capability. This makes the photodetector 31 itself very expensive, and increases the size of the photodetector 31 against the demand of downsizing thereof. Therefore, there is also a demand for improvement in these points on the photodetector 31.

SUMMARY OF THE INVENTION

The present invention has been made in view of the above problems, and therefore, an object thereof is to provide a photodetector which is capable of attaining an enhanced detection accuracy and at the same time permits reduction in size and manufacturing costs thereof.

To attain the above object, the invention provides a photodetector including a photodiode for detecting an incident light, in a state of a predetermined bias voltage set thereto, and a cooler for cooling the photodiode to a predetermined cooling temperature, wherein an amount of the incident light on the photodiode is detected based on a detection signal from the photodiode.

The photodetector according to the invention is characterized by comprising a control block that adjusts at least one of the bias voltage and the predetermined cooling temperature such that a value of the detection signal from the photodiode generated in a state of the incident light being blocked from impinging on the photodiode is held within a predetermined tolerance range.

Here, the photodiode includes diodes for use in detection of light, such as an avalanche photodiode and a PIN photodiode.

According to this photodetector, the control block adjusts at least one of the bias voltage and the predetermined cooling temperature of the photodiode, thereby holding the value of the detection signal from the photodiode generated in a state of the incident light being blocked from impinging on the photodiode, within a predetermined tolerance range. This makes it possible to maintain constant operating conditions of the photodiode in the state of a signal light being blocked from impinging on the photodiode, with high accuracy, thereby enabling an extremely weak light to be sensed or measured with high accuracy. Further, it is possible to dispense with a voltage detection block which is conventionally required for high-accuracy control of the bias voltage, and high detection accuracy is also no longer required of the temperature sensor for detecting the cooling temperature of the photodiode. This make it possible to reduce the manufacturing costs and size of the photodetector.

Preferably, the photodetector includes a sensor block for converting the detection signal from the photodiode to a pulse signal, and counting pulses of the pulse signal to thereby detect the amount of the incident light, and the control block adjusts the at least one of the bias voltage and the predetermined cooling temperature such that a count value of the pulses counted by the sensor block in the state of the incident light being blocked from impinging on the photodiode is within a predetermined range, to thereby hold the value of the detection signal within the predetermined tolerance range.

According to this preferred embodiment, the count value of pulses of the pulse signal counted by the sensor block in a state of the incident light being blocked from impinging on the photodiode is maintained at a predetermined value or within a predetermined range. This makes it possible to digitally process or handle the value of the detection signal. Therefore, it is possible to carry out the measurement of a signal light more accurately and promptly than in a method of maintaining an analog amount, such as a current value, at a predetermined amount.

Preferably, the control block adjusts the bias voltage.

According to the preferred embodiment, the control block controls the bias voltage of the photodiode, whereby it is possible to control the operating conditions of the photodiode very promptly.

The present disclosure relates to subject matter contained in Japanese Patent Application No.2000-81108, filed on Mar. 23, 2000, the disclosure of which is expressly incorporated herein by reference in the entirety.

BRIEF DESCRIPTION OF THE DRAWINGS

These and other objects and features of the present invention will be explained in more detail below with reference to the attached drawings, wherein.

DESCRIPTION OF THE PREFERRED EMBODIMENT

Figure 1:
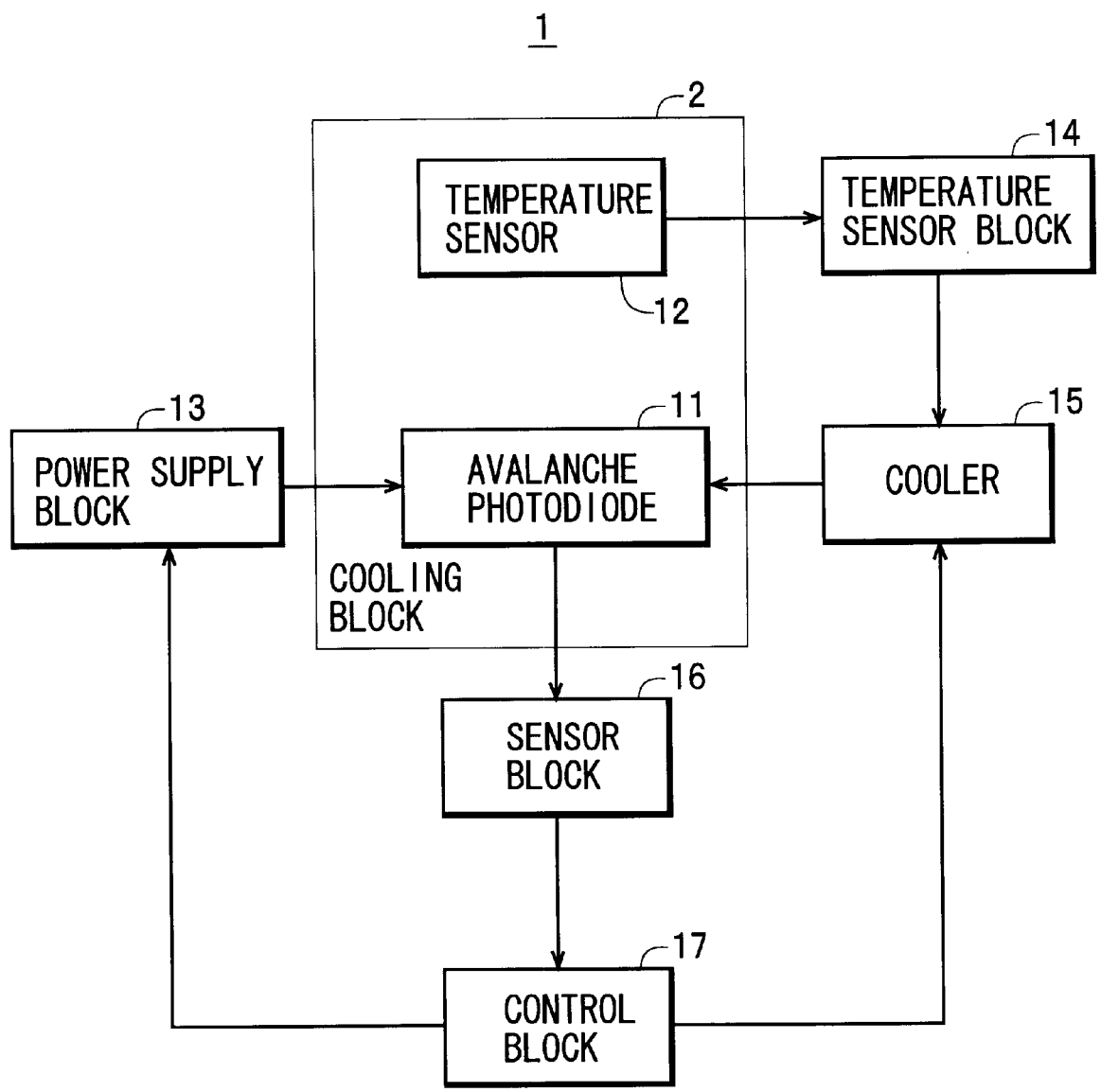
FIG. 1 is a block diagram showing the arrangement of a photodetector according to an embodiment of the invention.

The invention will now be described in detail with reference to the drawings showing a preferred embodiment thereof. In the following description of the embodiment, component parts and elements similar to those of the photodetector 31 developed by the present assignee are designated by identical reference numerals, and detailed description thereof is omitted.

The photodetector 1 is constructed such that it is capable of sensing a near-infrared light with wavelengths of 0.9 to 1.55 $\mu$m at a high detecting efficiency within a range of light powers of 0.0001 to 10 pW (picowatt) More specifically, as shown in FIG. 1, the photodetector 1 includes a cooling block 2 containing an avalanche photodiode 11 and a temperature sensor 12 as well as a power supply block 13, a temperature sensor block 14, a cooler 15, a sensor block 16, and a control block 17.

The cooling block 2 is held under vacuum by an evacuation system, not shown, and has a pedestal arranged therein on which the avalanche photodiode 11 and the temperature sensor 12 can be mounted. The avalanche photodiode 11 corresponding to a photodiode of the invention is cooled to a predetermined cooling temperature by the cooler 15 so as to reduce dark current thereof. Further, the avalanche photodiode 11 has a bias voltage set thereto so as to cause the avalanche photodiode 11 to operate in an operating range where avalanche amplification is readily induced. Hence, when an extremely weak signal light impinges on the avalanche photodiode 11, the avalanche photodiode 11 converts the incident signal light to a current signal by avalanche amplification, and outputs the current signal as a detection signal indicative of the detected amount of the incident signal light to the sensor block 16. The temperature sensor 12 is mounted on the pedestal in the cooling block 2, for detecting a temperature of the avalanche photodiode 11 cooled by the cooler 15 and delivers a signal indicative of the sensed temperature to the temperature sensor block 14. The power supply block 13 has an output voltage thereof controlled by the control block 17 to thereby maintain the bias voltage of the avalanche photodiode 11 at a predetermined setting voltage. The temperature sensor block 14 approximately detects temperature of the avalanche photodiode 11 based on the signal from the temperature sensor 12. Further, the cooler 15 is formed by a Stirling cooler, an electronic cooling element, or a cooling device making use of liquid nitrogen, for cooling the pedestal in the cooling block 2 such that the temperature of the avalanche photodiode 11 detected by the temperature sensor block 14 becomes equal to a preset temperature (predetermined cooling temperature) set by the control block 17. The sensor block 16 converts the detection signal delivered from the avalanche photodiode 11 to a pulse voltage (pulse signal), and counts pulses of the pulse voltage by a counter incorporated therein. The control block 17 is implemented by a CPU or a DSP, and controls the power supply block 13 for control of the bias voltage of the avalanche photodiode 11, and controls the cooler 15 for control of the temperature of the avalanche photodiode 11, based on the count value delivered from the sensor block 16.

Figure 2:
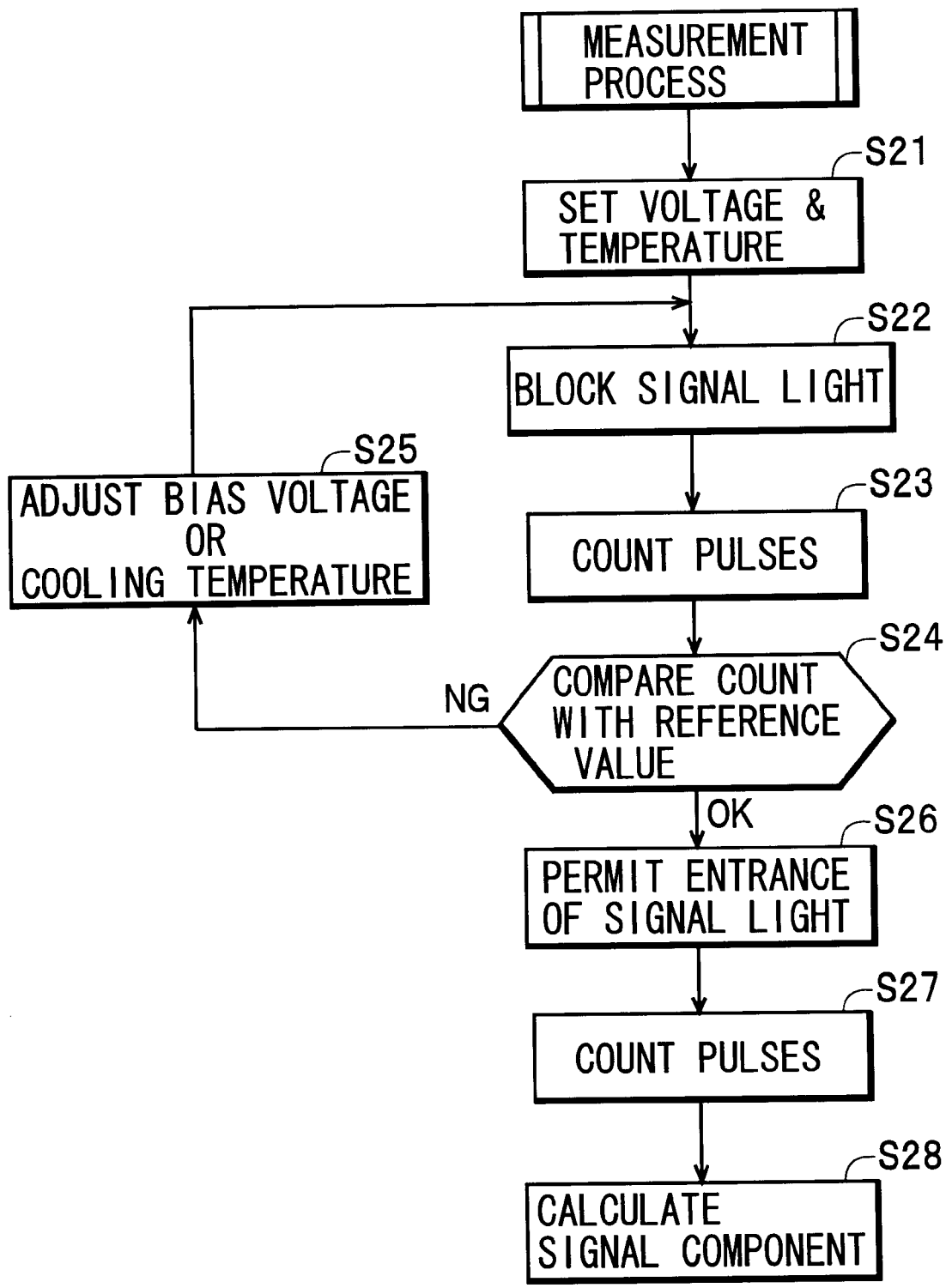
FIG. 2 is a flowchart showing a measurement process carried out by the FIG. 1 photodetector.
Figure 3:
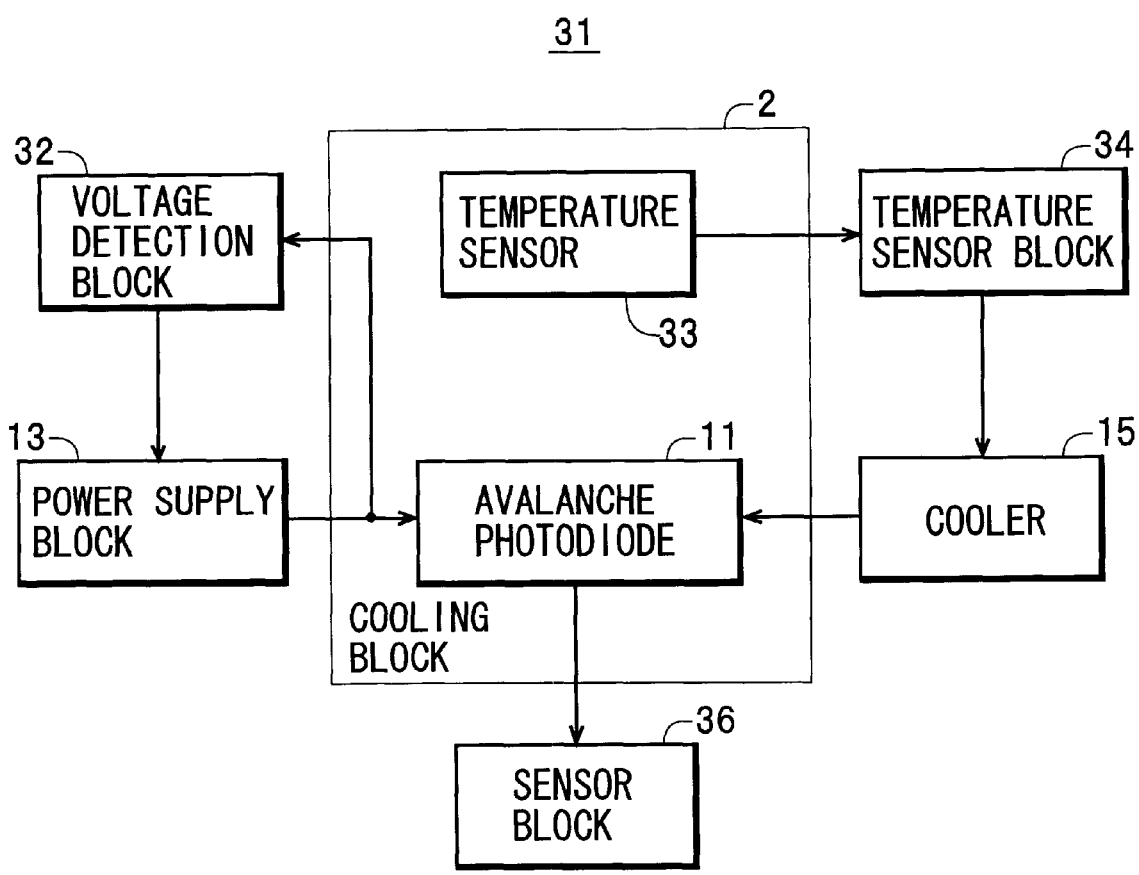
FIG. 3 is a block diagram showing the arrangement of a conventional photodetector developed by the present assignee.

Next, a measurement process performed by the photodetector 1 will be described with reference to FIG. 2.

First, the control block 17 sets the bias voltage and the cooling temperature of the avalanche photodiode 11 at a step S21. In this process, the control block 17 controls the output voltage of the power supply block 13 to thereby set the bias voltage of the avalanche photodiode 11 to the predetermined setting voltage, and at the same time sets the cooling temperature of the cooler 15, thereby causing the avalanche photodiode 11 to be cooled to the preset temperature. Thereafter, the cooler 15 carries out feedback control, thereby maintaining the temperature of the avalanche photodiode 11 detected by the temperature sensor block 14 at the preset temperature.

Next, the aperture of a condensing optical system, not shown, which is arranged in an input slit of the avalanche photodiode 11, is closed, thereby blocking a signal light from impinging on the avalanche photodiode 11 at a step S22. Then, in this state, the sensor block 16 converts the detection signal commensurate with the dark current flowing through the avalanche photodiode 11 to the pulse signal, counts pulses of the pulse signal exceeding a predetermined threshold, and delivers a count value to the control block 17 at a step S23. Next, the control block 17 compares the count value with a predetermined reference value at a step S24, and when the count value falls outside a predetermined tolerance range set with respect to the predetermined reference value such that the predetermined reference value is in the center of the range, at a step S25, the control block 17 adjusts the bias voltage of the avalanche photodiode 11 by changing the output voltage of the power supply block 13, or alternatively adjusts the predetermined cooling temperature of the avalanche photodiode 11 by changing the cooling temperature of the cooler 15. In this process, if the count value is slightly larger or smaller than the tolerance range, the bias voltage is adjusted. In this case, it is possible to very promptly adjust the count value to a value within the tolerance range. On the other hand, when the count value is significantly larger or smaller than the tolerance range, the cooling temperature of the cooler 15 is changed. In this case, although it takes somewhat longer time for adjustment, it is possible to correct the count value to a value within the tolerance range without largely changing signal light-sensing characteristics of the avalanche photodiode 11. It should be noted that the above adjustment process is carried out at an interval between actual detection processes for detecting incident signal lights.

When the count value is converged within the tolerance range, the aperture of the condensing optical system is opened to thereby allow a signal light to impinge on the avalanche photodiode 11 at a step S26. Then, in this state, the sensor block 16 counts pulses of the pulse signal exceeding the predetermined threshold, and delivers the count value to the control block 17 at a step S27. In this case, the control block 17 carries out a signal component calculation process at a step S28. In the signal component calculation process, the control block 17 eliminates, by cancellation, a count value obtained in the state of the signal light being blocked from impinging on the avalanche photodiode 11 from a count value obtained when the signal light being permitted to impinge on the avalanche photodiode 11, whereby a count value corresponding only to the signal light itself can be calculated. In this case, the count value corresponding to the amount of noise detected when the signal light being blocked from impinging on the avalanche photodiode 11 can be accurately cancelled out, so that it is possible to detect the amount of the incident signal light with high accuracy.

As described hereinabove, differently from the conventional photodetector 31 that controls the bias voltage and the cooling temperature such that the operating conditions of the avalanche photodiode 11 can be maintained as constant as possible, in the photodetector 1, the bias voltage or the cooling temperature is adjusted such that the count value of pulses of the pulse voltage counted by the sensor block 16 is within the predetermined tolerance range, whereby the operating conditions of the avalanche photodiode 11 in the state of a signal light being blocked from impinging on the avalanche photodiode 11 can be held constant with high accuracy. This makes it possible to detect the amount of an extremely weak near-infrared light incident on the avalanche photodiode 11 with high accuracy. Further, it is possible to dispense with a voltage detection block 32 for monitoring the bias voltage supplied from the power supply block 13. Furthermore, since the temperature sensor 12 or the temperature sensor block 14 are not required to have high detection accuracy, manufacturing costs and size of the photodetector 1 can be reduced. Still further, it is possible to dispense with a cable for use in detecting the bias voltage of the avalanche photodiode 11. This reduces a flow of heat into the temperature sensor 12. Therefore, the change in the cooling temperature of the avalanche photodiode 11 can be held in a narrower range, whereby the operating conditions of the avalanche photodiode 11 can be held even more stable. Further, since it is possible to dispense with the cable for use in detecting the bias voltage of the avalanche photodiode 11, noise can be prevented from being mixed via the cable into the detection signal delivered from the avalanche photodiode 11. This enables further enhancement of optical sensing accuracy of the photodetector 1.

It should be noted that the present invention is by no means limited to the above embodiment. For instance, although in the above embodiment, the sensor block 16 counts pulses (photons) included in a signal light, this is not limitative, but the sensor block 16 may detect e.g. the value of a current flowing through the avalanche photodiode 11, thereby detecting the amount of an incident signal light. In this case, the dark current flowing through the avalanche photodiode 11 may be controlled such that the same is within a predetermined tolerance current range set with respect to a reference current value.

What is claimed is:

1. A photodetector including a photodiode that detects an incident light, when a predetermined bias voltage is set thereto, and a cooler that cools said photodiode to have a predetermined cooling temperature, wherein an amount of said incident light on said photodiode is detected based on a detection signal from said photodiode, the photodetector comprising:

a control block that adjusts at least one of said bias voltage and said predetermined cooling temperature such that a value of said detection signal from said photodiode generated when said incident light is blocked from impinging on said photodiode is held within a predetermined tolerance range; and a sensor block that converts said detection signal from said photodiode to a pulse signal, and counts pulses of said pulse signal.

2. A photodetector including a photodiode that detects an incident light, when a predetermined bias voltage is set thereto, and a cooler that cools said photodiode to have a predetermined cooling temperature, wherein an amount of said incident light on said photodiode is detected based on a detection signal from said photodiode, the photodetector comprising:
- a control block that adjusts at least one of said bias voltage and said predetermined cooling temperature such that a value of said detection signal from said photodiode generated when said incident light is blocked from impinging on said photodiode is held within a predetermined tolerance range; and
- a sensor block that converts said detection signal from said photodiode to a pulse signal, and counts pulses of said pulse signal to thereby detect said amount of said incident light,
- wherein said control block adjusts said at least one of said bias voltage and said predetermined cooling temperature such that a count value of said pulses counted by said sensor block when said incident light is blocked from impinging on said photodiode is within a predetermined range, to thereby hold said value of said detection signal within said predetermined tolerance range.

3. A method of detecting light incident onto a photodetector, when predetermined bias voltage is set to the photodiode and cooling the photodiode to have a predetermined cooling temperature, wherein an amount of the light incident on the photodiode is detected based on a detection signal from the photodiode, the method of detection comprising:
- adjusting at least one of the bias voltage and the predetermined cooling temperature such that a value of the detection signal from the photodiode generated when the incident light is blocked from impinging on the photodiode is held within a predetermined tolerance range;
- converting the detection signal from the photodiode to a pulse signal; and
- counting pulses of said pulse signal to thereby detect the amount of the incident light,
- the adjustsing of the at least one of the bias voltage and the predetermined cooling temperature comprises adjusting such that a count value of the pulses when the incident light is blocked from impinging on the photodiode is within a predetermined range, to thereby hold the value of said detection signal within the predetermined tolerance range.

* * * * *